United States Patent
Dickerson et al.

(10) Patent No.: US 9,978,620 B2
(45) Date of Patent: May 22, 2018

(54) METHOD AND APPARATUS FOR REDUCING RADIATION INDUCED CHANGE IN SEMICONDUCTOR STRUCTURES

(71) Applicant: Applied Materials, Inc., Santa Clara, CA (US)

(72) Inventors: Gary E. Dickerson, Gloucester, MA (US); Seng (victor) Keong Lim, Fremont, CA (US); Samer Banna, San Jose, CA (US); Gregory Kirk, Pleasanton, CA (US); Mehdi Vaez-Iravani, Los Gatos, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days. days.

(21) Appl. No.: 15/584,767

(22) Filed: May 2, 2017

(65) Prior Publication Data

US 2017/0271181 A1    Sep. 21, 2017

Related U.S. Application Data

(62) Division of application No. 15/075,094, filed on Mar. 18, 2016, now Pat. No. 9,646,893.
(Continued)

(51) Int. Cl.
*H01L 21/67*  (2006.01)
*H01L 21/324* (2006.01)
(Continued)

(52) U.S. Cl.
CPC ...... *H01L 21/67248* (2013.01); *H01L 21/324* (2013.01); *H01L 21/0273* (2013.01);
(Continued)

(58) Field of Classification Search
CPC combination set(s) only.
See application file for complete search history.

(56) References Cited

U.S. PATENT DOCUMENTS 7,528,392 B2   5/2009  England et al.
7,868,306 B2   1/2011  Ramappa
(Continued)

OTHER PUBLICATIONS

International Search Report dated May 30, 2016 for Application No. PCT/US2016/019116.

*Primary Examiner* — Mamadou Diallo
(74) *Attorney, Agent, or Firm* — Patterson & Sheridan, LLP

(57) ABSTRACT

Embodiments of the present disclosure relate to an apparatus and a method for reducing the adverse effects of exposing portions of an integrated circuit (IC) device to various forms of radiation during one or more operations found within the IC formation processing sequence by controlling the environment surrounding and temperature of an IC device during one or more parts of the IC formation processing sequence. The provided energy may include the delivery of radiation to a surface of a formed or a partially formed IC device during a deposition, etching, inspection or post-processing process operation. In some embodiments of the disclosure, the temperature of the substrate on which the IC device is formed is controlled to a temperature that is below room temperature (e.g., <20° C.) during the one or more parts of the IC formation processing sequence.

20 Claims, 6 Drawing Sheets

Related U.S. Application Data

(60) Provisional application No. 62/135,476, filed on Mar. 19, 2015.

(51) Int. Cl.
  *H01L 21/683* (2006.01)
  *H01L 21/66* (2006.01)
  *H01L 21/027* (2006.01)

(52) U.S. Cl.
  CPC ... *H01L 21/67103* (2013.01); *H01L 21/67115* (2013.01); *H01L 21/67253* (2013.01); *H01L 21/6831* (2013.01); *H01L 22/12* (2013.01)

(56) References Cited

U.S. PATENT DOCUMENTS

| | | | |
|---|---|---|---|
| 7,935,940 B1 | 5/2011 | Smargiassi | |
| 7,935,942 B2 | 5/2011 | England et al. | |
| 7,977,652 B2 | 7/2011 | Fish et al. | |
| 7,993,698 B2 | 8/2011 | Blake et al. | |
| 8,020,398 B2 | 9/2011 | Fish et al. | |
| 8,124,506 B2 | 2/2012 | Hatem et al. | |
| 8,149,256 B2 | 4/2012 | Fish et al. | |
| 8,319,196 B2 | 11/2012 | England et al. | |
| 8,328,494 B2 | 12/2012 | Fish et al. | |
| 8,329,260 B2 | 12/2012 | Blake et al. | |
| 2002/0196433 A1* | 12/2002 | Biellak | G01N 21/958 356/239.1 |
| 2004/0050905 A1 | 3/2004 | Endo et al. | |
| 2004/0070415 A1 | 4/2004 | Schneidewind et al. | |
| 2004/0207836 A1* | 10/2004 | Chhibber | G01N 21/4738 356/237.4 |
| 2005/0140962 A1* | 6/2005 | Ottens | G03F 7/70783 355/75 |
| 2006/0113290 A1* | 6/2006 | Shareef | B23K 26/703 219/121.82 |
| 2008/0305434 A1 | 12/2008 | Nishi et al. | |
| 2009/0153824 A1* | 6/2009 | Balan | G03B 27/42 355/67 |
| 2010/0065758 A1 | 3/2010 | Liu et al. | |
| 2010/0084744 A1* | 4/2010 | Zafiropoulo | B23K 26/0608 257/618 |
| 2011/0279805 A1* | 11/2011 | Ryzhikov | G02B 13/04 355/72 |
| 2013/0321788 A1* | 12/2013 | Ockwell | G03F 7/707 355/72 |
| 2014/0001746 A1 | 1/2014 | Fish et al. | |
| 2014/0001747 A1 | 1/2014 | Fish et al. | |
| 2014/0253900 A1* | 9/2014 | Cornelissen | G03F 7/70708 355/72 |
| 2014/0262157 A1 | 9/2014 | Citver et al. | |
| 2014/0270905 A1 | 9/2014 | Riaf | |
| 2014/0318455 A1* | 10/2014 | Blake | H01L 21/6831 118/725 |
| 2015/0009602 A1* | 1/2015 | Adachi | H01L 21/6833 361/234 |
| 2015/0077733 A1* | 3/2015 | Huang | G03F 7/70633 355/72 |

\* cited by examiner

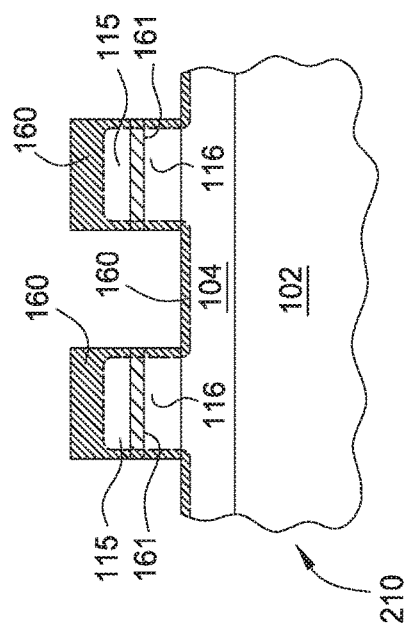
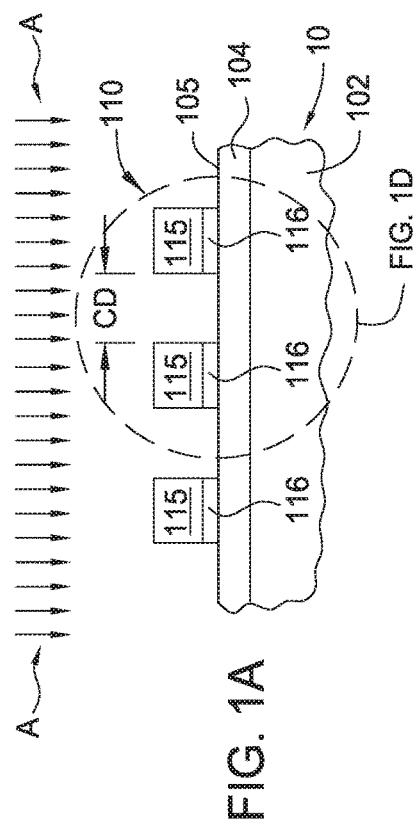
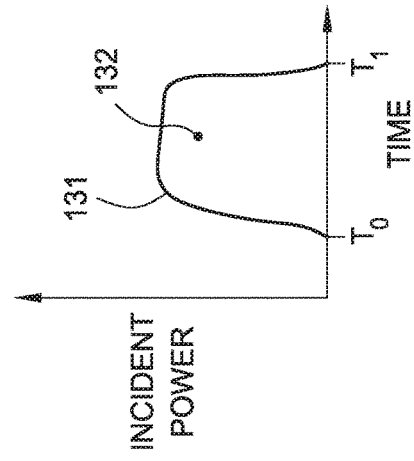
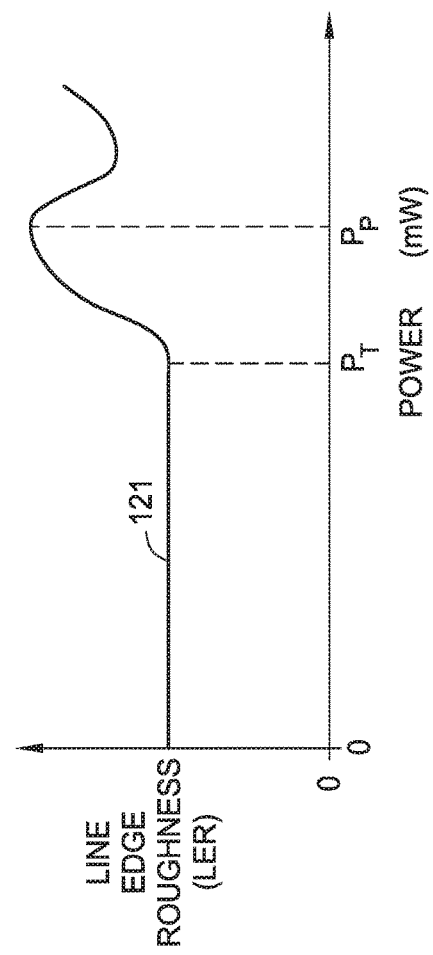

METHOD AND APPARATUS FOR REDUCING RADIATION INDUCED CHANGE IN SEMICONDUCTOR STRUCTURES

CROSS-REFERENCE TO RELATED APPLICATIONS

This application is a divisional of U.S. patent application Ser. No. 15/075,094 filed on Mar. 18, 2016, which claims benefit of U.S. provisional patent application Ser. No. 62/135,476, filed Mar. 19, 2015, which are both hereby incorporated herein by reference.

BACKGROUND OF THE DISCLOSURE

Field of the Disclosure

Embodiments of the present disclosure generally relate to the fabrication of integrated circuits and particularly to an apparatus and method for reducing change created within semiconductor devices due to their exposure to various types of radiation during a formation or inspection process.

Description of the Related Art

The integrated circuit (IC) market is continually demanding greater memory capacity, faster switching speeds, and smaller feature sizes. Reducing the size of integrated circuits (ICs) results in improved performance, increased capacity and/or reduced cost. Each size reduction, or IC processing node shift, requires more sophisticated techniques to form the various components within the ICs. As IC devices become smaller the physical integrity and dimensional stability of structures formed within the IC device becomes much more challenging to reliably maintain when they are exposed to various forms of radiation provided energy during typical IC forming and inspection processes. For example, photolithography and etching processes are commonly used to pattern various layers formed in the IC device, such as a photoresist layer, spin-on-carbon (SOC) layer, BARC layer and hard mask layers. The exposure of these various layers to the energy generated during the photolithography and etching operations, such as RF energy and electromagnetic radiation used during inspection or post-processing operations can alter, change or adversely affect the properties of the formed IC layers and structures.

One aspect of the IC device structure that can be readily affected during the IC fabrication process, due to the exposure to one or more forms of energy, is line width roughness (LWR) or line edge roughness (LER) that are created in a photolithographic process. As known in the art, LWR is defined as the excessive variations in the width of the patterned photoresist feature formed after the unexposed portions of the photoresist are stripped from the substrate in, for example, a negative resist type lithography process. If the variations occur on the side surface of the photoresist relief or feature the variation is known as LER. An increase in roughness or variations in LWR or LER due to the exposure to various forms of energy during processing is disadvantageous, as the increased roughness variation may be transferred onto various features during the subsequent etching process, and thus ultimately into the formed IC circuit. The variations become more significant as the feature size of the photoresist relief or trenches is decreased. For 32 nm devices variations of 4 nm or larger have been observed. Because the geometrical shape of a patterned resist feature, including line roughness effects (e.g., LWR and LER), is transferred from a patterned photoresist layer to an underlying permanent layer of a device during patterning of the underlying layer, LWR and LER can limit the ability to form devices of acceptable quality for dimensions below about 100 nm. Such variations may lead to non-uniform circuits and ultimately device degradation or failure.

Therefore, as devices shrink to smaller dimensions, current IC fabrication processes are challenged to create devices that can be formed with the required physical and structural properties, and desired critical dimensions (CD). Therefore, there is a need for new apparatuses and methods that can reduce the damaging effects of radiation provided during an IC fabrication process on the physical properties, electrical properties and dimensional stability of structures formed within an IC on a substrate.

SUMMARY OF THE DISCLOSURE

Embodiments of the present disclosure relate to an apparatus and a method for reducing the adverse effects of exposing portions of an integrated circuit (IC) device to various forms of radiation during an IC formation processing sequence that may include a deposition operation, an etching operation, an ashing operation, an annealing operation, an inspection operation and/or a post-processing process operation. In some embodiments of the disclosure, the temperature of the substrate on which the IC device is formed is controlled to a temperature that is below the preprocessing temperature of the substrate, such as room temperature.

Embodiments of the disclosure provide a method of inspecting a surface of a substrate, comprising positioning a substrate on a substrate support assembly that is maintained at a temperature that is less than 20° C., exposing a region of a surface of the chucked substrate to an amount of radiation, wherein the exposed region achieves a first peak temperature due to the exposure to the amount of radiation, and the first peak temperature is less than a threshold temperature for all materials in the exposed region. The substrate may be chucked to the substrate supporting surface of the substrate support assembly, wherein the substrate support surface is maintained at a temperature that is less than 20° C., such as a temperature less than 0° C., or even a temperature of between −30° C. and −100° C.

Embodiments of the disclosure may further provide a substrate inspection apparatus, comprising a process chamber defining a processing region, a substrate support comprising a substrate chuck that has a substrate supporting surface that is disposed within the processing region, a radiation source that is configured to deliver radiation towards the substrate supporting surface of the substrate support, a support assembly that comprises one or more actuators that are configured to translate the substrate support and substrate chuck relative to the radiation source, a temperature control assembly that is in thermal communication with the substrate supporting surface, wherein the temperature control assembly is configured to cool the substrate supporting surface to a first temperature that is less than 20° C.; and a radiation detector configured to detect radiation reflected or scattered from a surface of a substrate that is disposed on the substrate supporting surface of the substrate support during an inspection process performed in the process chamber.

Embodiments of the disclosure may further provide a method of inspecting a surface of a substrate, comprising positioning a substrate on a substrate support assembly in a process chamber, the process chamber located in a first environment, wherein positioning the substrate comprises chucking the substrate to a substrate supporting surface of a substrate support assembly, wherein the substrate supporting surface is cooled to a temperature less than 0° C. The method further comprising exposing a region of a surface of the chucked substrate to radiation, wherein the exposed region achieves a first peak temperature due to the exposure to the radiation, wherein the first peak temperature is less than 150° C. The method further comprising maintaining the temperature of the substrate supporting surface at less than 0° C. during the exposure of the surface of the chucked substrate to the radiation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1A illustrates a cross-sectional view of a patterned structure formed on substrate, according to an embodiment of the disclosure.

FIG. 1B is a graph depicting the effect of exposing a semiconductor structure formed on substrate to an increasing amount of energy during one or more operations within a semiconductor fabrication process, according to one embodiment of the disclosure.

FIG. 1C is a graph depicting an amount of energy that is provided to the exposed region of the semiconductor structure due to the delivery of the radiation provided from a radiation source as a function of time, according to one embodiment of the disclosure.

FIG. 1D illustrates a cross-sectional view that illustrates the exposed portions of the patterned structure shown in FIG. 1A after being exposed to the radiation "A", according to an embodiment of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1E:
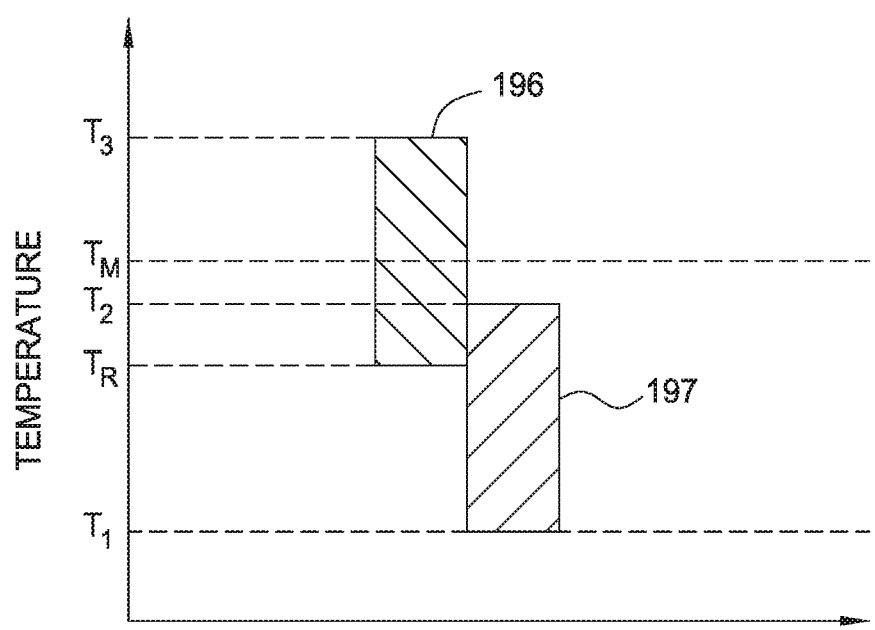
FIG. 1E is a graph depicting a temperature rise of an IC structure formed on a substrate based the delivery of an amount of radiation and a temperature rise of the same IC structure that is exposed to same amount of radiation when using one or more of the exemplary methods and apparatuses disclosed herein.

Embodiments of the present disclosure relate to an apparatus and a method for reducing the adverse effects that may occur when exposing portions of an integrated circuit (IC) device to various forms of energy during one or more operations found within an IC formation processing sequence by controlling the environment surrounding and temperature of the IC device during the one or more operations. The provided energy may include the delivery of radiation to a surface of a formed or a partially formed IC device during a deposition, etching, inspection or post-processing process operation. In some embodiments of the disclosure, the temperature of the substrate on which the IC device is formed is controlled to a temperature that is below room temperature (e.g., <20° C.) during one or more parts of the IC formation processing sequence.

In one example, a method and apparatus is used to reduce the adverse effects of exposing portions of patterned regions of an IC device to radiation during one or more semiconductor processing operations used to pattern, inspect and/or form the IC device. FIG. 1A illustrates a portion of an IC device 10 that has been patterned by use of an optical lithography technique to form a plurality of patterned regions. The patterned regions may be formed using one or more optical lithography processes to generate a patterned structure 110 in one or more of the underlying layers 104. During an optical lithography process, the surface 105 of a substrate 102 is finally coated with photo-curable, polymeric photoresist 115 after certain patterning or other films are deposited. The polymeric photoresist 115 is then optically patterned using a stepper, and then developed and baked at temperatures less than about 150° C. to form the patterned structure 110, as shown in FIG. 1A. The patterned photoresist layer contains a polymeric photoresist 115 material that has gone through a plurality of photolithography processing operations, such as a resist coating operation, soft bake operation (e.g., bake at temperature of 120° C. for 60 seconds), exposure operation, post exposure bake (PEB) operation (e.g., bake at temperature of 110° C. for 60 seconds), develop operation and then a hard bake operation (e.g., bake at temperature of 150° C. for 60 seconds). In some configurations, the patterned structure 110 may include a polymeric photoresist 115 and one or more additional patterning layers 116. The one or more additional patterning layers 116 may include a spin-on-carbon (SOC) layer, BARC layer and/or one or more hardmask layers. Next, during an etching process, the pattern formed in the patterned structure 110 can be transferred to the underlying layers 104 below, by etching the exposed regions of the underlying layers 104. The underlying layers 104 may include portions of one or more hard mask layers, dielectric layers and/or device film layers that are to be patterned. The often physically and dimensionally fragile components formed in the patterned structure 110 may also be further processed using one or more additional semiconductor processing operations.

In general, the additional semiconductor processing operations may include the delivery of radiation to the surface of a substrate during a deposition, etching, ashing, thermal processing, inspection and/or post-processing process operation, as discussed above. In one example, during an inspection process the patterned structure 110 and exposed portions of the substrate 102 are exposed to a form of radiation "A" that is used to determine some physical property, material property or other compositional, dimensional or defect related attribute of the surface of the substrate 102. Inspection processes will generally include one or more IC device metrology inspection operations, surface imaging operations, defect inspection operations and/or material characterization inspection operations. During these inspection processes the radiation "A," e.g., a probing beam or spot, may be delivered to the exposed regions of the substrate 102 as a small area spot that has an exposure area (e.g., illuminated area) that is significantly smaller than the surface of the substrate 102. In this type of inspection process, the small area spot is scanned across the surface of the substrate 102 to determine a property of the substrate 102. In one example, the small area spot may have an area of between about 0.1 square micrometer ($\mu m^2$) to about 10 $\mu m^2$. Alternately, the radiation "A," or probing beam, may be a large area beam that "floods" at least a large portion of the surface of the substrate 102. In one example, the small area spot may have an area of between about 0.1 square millimeter ($mm^2$) and about 10 $mm^2$. In either case, the radiation "A," or probing beam, may be provided to the substrate 102 as electromagnetic radiation, an electron beam or an ion beam. In cases where the radiation "A" includes electromagnetic radiation, the radiation may be a form of coherent or non-coherent radiation that may be delivered as a continuous wave (CW) of electromagnetic energy or as pulses of electromagnetic energy.

Since the delivery of a probing beam or spot to a surface of the substrate may change or affect the properties of the exposed layers, embodiments of the present disclosure may be advantageously used to prevent the exposed surfaces of a formed or a partially formed IC structure from becoming altered or undesirably changed. Embodiments disclosed herein can be advantageously used to prevent portions of an IC structure from being changed during an inspection process. In general, the inspection processing operations are not intended to modify the inspected structures formed on the substrate surface. However, due to the shrinking size of the IC devices, and the use of layers within these structures that have optically absorbing and thermally insulating properties, the use of a probing beam of radiation during an inspection operation can increase the temperature of the probed region to a point where the film layers can become changed. For example, inspection systems using ultraviolet (UV) and/or deep UV wavelength beam(s) that are delivered at typical inspection power levels may increase the temperature of 32 nm advanced IC patterned structures which may undesirably cause changes to the materials in these structures. Thus, in some embodiments, the temperature of a partially formed IC structure is controlled, during an inspection processing operation, to a temperature that is less than the temperature of the substrate before the process, such as room temperature. The temperature at which the substrate is maintained may be less than zero degrees Celsius to prevent change from occurring in the exposed film layers.

FIG. 1B is a plot of the effect of exposing a region of a patterned structure to an increasing amount of incident radiation power (energy) on line-edge-roughness (LER), as illustrated by line 121, during one or more operations within an optical inspection process. FIG. 1C is a plot of power exposure (e.g., curve 131) as a function of time provided to the portion of the patterned structure 110 by the incident radiation. The amount of energy 132 provided to a region of the substrate 102 is a function of the integrated incident power (energy) provided over the exposure interval (e.g., time between time $T_0$ and time $T_1$), which is the area under the curve 131. The amount of incident power directly affects the temperature rise of the probed IC device, which can affect the amount of change or undesirable effects of exposing the IC device to the probing beam. The temperature rise created in the exposed structures will generally increase as the percentage of radiation absorption increases, the size of the exposed features decreases and/or the time of exposure, at a constant power level, decreases. As illustrated in FIG. 1B, the delivery of radiation to the substrate 102 generally does not have a detrimental effect on the physical, dimensional or material properties of the exposed regions until a threshold energy level, such as a threshold power level $P_T$ is reached. Thus, as illustrated in FIG. 1B, once the threshold incident radiation power level $P_T$ has been reached, a property of the exposed IC device can be dramatically changed, such as the LER of a photoresist pattern is dramatically increased. In this example, the measured LER of a structure exposed to radiation that is below the threshold power level $P_T$ is observed to remain at a relatively low level and at the peak power level $P_P$ the measured LER was almost doubled in magnitude. It is believed that the temperatures achieved by the materials found within an exposed region, which has received radiation at levels greater than the threshold power level $P_T$, will reach a level that is greater than their material degradation temperature or change threshold temperature. In one example, photoresist materials are known to degrade at temperatures greater than the hard bake temperature (e.g., typically 150° C.), thus radiation that is delivered to a photoresist material that cause its peak exposure temperature to exceed the hard bake temperature will cause changes to the photoresist material.

FIG. 1D illustrates a portion of an IC device 10 that includes various exposed regions 160 that have been exposed to the radiation "A". The temperature rise within and depth of the affected exposed regions 160 will depend on the amount of energy provided by the radiation "A", and the physical, optical absorption and/or heat transfer related properties of the exposed materials and adjacent material layers. In some configurations, due to the optically transparent nature of the over lying layer(s), the radiation "A" can reach and be absorbed in one or more of the underlying layers. In one example, exposed regions 161 are formed in portions of the underlying patterning layers 116 due to the delivery of the radiation "A" to the IC device structure. Therefore, the effect of the probing beam on the IC device will depend on the properties of the delivered radiation (e.g., wavelength, power, duration, etc.) and the physical, material, thermal and optical properties of the exposed regions of the IC device formed on the substrate.

FIG. 1E illustrates a comparative example of the temperature rise created in an IC device structure formed on a surface of a substrate based on the use of a conventional processing technique, which is illustrated as temperature rise 196, and a temperature rise 197 created in the same device structure that is processed using one of the processing techniques described herein. In the conventional processing technique example, the substrate is provided at a conventional process starting temperature, which in this example is assumed to be about room temperature $T_R$. Therefore, based on the size of the device structure, thermal and optical properties of the exposed regions of the device structure and the energy provided by the radiation delivered to the device structure, the temperature rise ($\Delta T$) will equal $T_3$ minus $T_R$, where $T_3$ is the peak temperature of the exposed components in the device structure. However, it is believed that the peak temperature $T_3$ achieved using some conventional processing techniques can exceed a temperature that will change the physical or electrical properties of one or more materials within the exposed IC device structure.

In an effort to prevent a formed or partially formed IC device from becoming changed during processing, in some embodiments, the substrate is cooled to a first processing temperature $T_1$, which is less than 20° C., such as a temperature between about −30° C. and −100° C. In this case, the device structure will achieve a temperature rise that is equal to the second temperature $T_2$ minus the first temperature $T_1$, where the second temperature $T_2$ is the peak temperature of the exposed components in the device structure. In general, the first temperature $T_1$ is controlled by use of the hardware components described below so that the second temperature $T_2$ is lower than a temperature at which the materials in the IC device structure will become changed by the delivery of the incident radiation, which is illustrated as temperature $T_M$ in FIG. 1E. In one example, the first temperature $T_1$ is controlled to a level, such that the temperature rise 197, does not allow a photoresist material on the surface of the substrate to exceed the photoresist hard bake temperature (e.g., second temperature $T_2 \leq 150°$ C.).

Hardware and Process Chamber Configuration Examples

Figure 2:
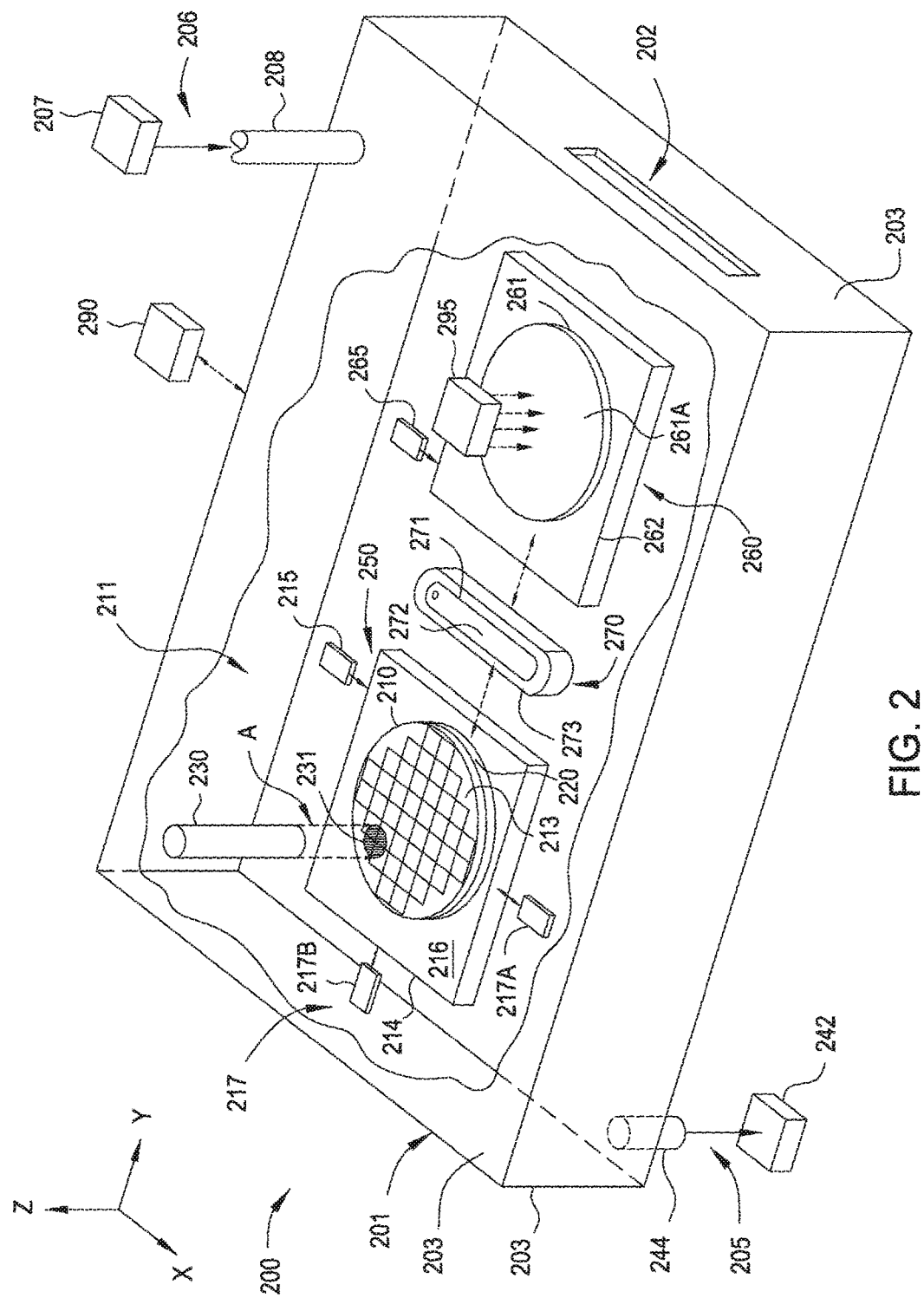
FIG. 2 is an isometric partial cross-sectional view of a process chamber, according to an embodiment of the disclosure.

FIG. 2 illustrates an isometric cross-sectional view of a process chamber 200 that is configured to control the temperature of at least a portion of a substrate 210 that is exposed to radiation delivered from a source 230, during one or more parts of the IC formation processing sequence. The process chamber 200 generally includes a substrate enclosure 201, a substrate support assembly 250, a temperature control assembly 215, a system controller 290, a gas delivery system 206 and an exhaust system 205. The substrate enclosure 201 generally includes a plurality of walls 203 that enclose a processing region 211. In some configurations, a window (not shown) is formed in or through one of the walls 203, which is disposed over the surface 213 of the substrate 210, to allow the radiation generated by a source 230, which is disposed outside of the substrate enclosure 201, to be delivered to an exposed region 231 of the substrate 210. The source 230 is adapted to provide radiation "A," which, as discussed above, may include electromagnetic radiation, an electron beam or an ion beam.

The substrate enclosure 201 may also include a sealable port 202 that allows a user or a robotic device (not shown) positioned outside of the substrate enclosure 201 to position a substrate 210 at a desired location within the process chamber 200. The sealable port 202 may include a slit valve (not shown) or other similar device that is adapted to prevent gases from passing between a region outside of the substrate enclosure 201 and the processing region 211 when the sealable port 202 is sealed.

The substrate support assembly 250 generally includes a support assembly 214 and an actuation assembly 217 that is adapted to move and/or position a substrate 210, which is disposed on a substrate supporting surface of the support assembly 214, relative to the radiation delivered from the source 230. The actuation assembly 217 may include one or more actuators 217A, 217B that are adapted to move and/or position the substrate 210 in at least one direction (e.g., X-direction, Y-direction and/or Z-direction). The actuators 217A, 217B may be any type of device that is able to move and position the support assembly 214, such as a linear motor, stepper motor and lead-screw, or other similar device.

The temperature control assembly 215 generally includes components that are able to control and maintain the temperature of the substrate 210 during processing. In some configurations, the temperature control assembly 215 may include a gas and/or liquid heat exchanger, Peltier device, or other similar device that is adapted to control the temperature of a substrate supporting surface of a support device 220 in the support assembly 214 to a desired temperature. The temperature control assembly 215 is generally adapted to control the temperature of the substrate supporting surface of the support device 220 by use of commands sent from the system controller 290. In one example, the substrate 210 is cooled to a temperature between about 20° C. and −195° C., such as between about 0° C. and about −100° C., or a temperature between about −30° C. and about −100° C., or even to a temperature between about −40° C. and about −100° C. using the temperature control assembly 215 components. In this case, the reduced substrate temperature can be used to compensate for the temperature rise created by the delivery of the radiation provided to the substrate 210 by the source 230. Thus, the maximum temperature reached by the structures within the IC device formed on the substrate 210 during the processing operation can be controlled so that the temperature does not exceed a maximum temperature threshold level (e.g., temperature $T_M$) or change threshold temperature, above which the layer will become changed, or physically or chemically changed in some undesirable way, such as impacting the functional properties of one or more materials in the layer.

In some embodiments, if the substrate temperature during processing is maintained at a temperature less than room temperature, it is desirable to control the composition of the gases that are found in the processing region 211, so that no condensation or other undesirable contamination will form on the cooled substrate and exposed supporting components during processing, such as the support assembly 214 components. In one configuration, the substrate enclosure 201 includes an exhaust system 205 that contains a pump 242 that is configured to evacuate and/or reduce the pressure within the processing region 211 during processing to remove any water or other contamination found therein. The pump 242 may be coupled to the processing region through an outlet 244 that is attached to a wall 203 of the substrate enclosure 201. In some configurations, the substrate enclosure 201 may include a gas delivery system 206 that contains a gas source 207 that is configured to deliver one or more gases to the processing region 211 during processing to remove any water or other contamination found therein. In some cases, the gas delivery system 206 and the exhaust system 205 may be used together so that any contaminants in the processing region 211 can be flushed out and/or removed from the process chamber 200. The gas delivery system 206 may be configured to deliver a dry, inert and/or non-reactive gas, such as nitrogen ($N_2$), argon (Ar), helium (He), neon (Ne), krypton (Kr), xenon (Xe), or other similar type of gas, and combinations thereof.

In some embodiments, to prevent the cooled substrate 210 from adsorbing or condensing an amount of water or other contamination when the substrate 210 is positioned in an environment external to the process chamber 200 after processing, the process chamber 200 may additionally include a heating station 260. The heating station 260 may include a temperature controlled substrate support assembly 262 that includes a thermal control device 261 and a thermal controller 265. The thermal control device 261 may include a gas or fluid heat exchanger and/or one or more resistive heating elements (not shown) and thermocouples (not shown). The thermal control device 261 also includes a surface 261A on which the substrate 210 may be placed to adjust the substrate's temperature before and/or after processing has been performed on the substrate 210 using the substrate support assembly 250. The thermal controller 265 is generally adapted to control the temperature of the surface 261A of the thermal control device 261 by use of commands sent from the system controller 290. In some embodiments, the temperature of the surface 261A of the thermal control device 261 is maintained at a temperature greater than the dew point of an environment that is found directly outside of the process chamber 200 (e.g., the environment surrounding and contacting the external portions of the process chamber). In one example, the temperature of the surface 261A is maintained at a temperature of between about 10° C. and 50° C. In some embodiments, the temperature of the surface 261A is maintained at a temperature less than room temperature, but greater than the dew point of the environment outside the process chamber. In this case, the temperature of the surface 261A of the thermal control device 261 will allow the temperature of the substrate 210 to be reduced before the substrate 210 is positioned on the colder substrate supporting surfaces of the substrate support assembly 250, so that the substrate 210 can be rapidly processed in the process chamber 200, and also allow the substrate 210 to be heated to a temperature after processing on the substrate support assembly 250 to prevent the adsorption of contaminants on the surface of the substrate 210 when the substrate 210 is moved outside of the process chamber 200.

In some embodiments of the heating station 260, the substrate may also be heated after being processed on the substrate support assembly 250 by use of radiant source 295. The radiant source 295 may include one or more lamps that are configured to rapidly and uniformly heat the substrate 210 positioned on the surface 261A of the heating station 260 to a desired temperature before the substrate 210 is removed from the processing region 211 of the process chamber 200.

The system controller 290 is used to control one or more components found in the process chamber 200. The system controller 290 is generally designed to facilitate the control and automation of the process chamber 200 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and control support hardware (e.g., sensors, internal and external robots, motors, radiation sources, lamps, etc.), and monitor the processes performed in the system (e.g., substrate support temperature, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 290 determines which tasks are performable on a substrate in the process chamber 200. Preferably, the program is software readable by the system controller 290 that includes code to perform tasks relating to monitoring, execution and control of the movement, support, and/or positioning of a substrate along with the various process recipe tasks (e.g., inspection operations, processing environment controls) and various chamber process recipe operations being performed in the process chamber 200.

In one embodiment of the process chamber 200, a robotic device 270 is configured to transfer a substrate 210 in either direction between the heating station 260 and the substrate support assembly 250. The robotic device 270 may include an upper robot arm 271, having a substrate supporting surface 272, and a lower arm 273 that are coupled together and to an actuator (not shown), so that the robotic device 270 can transfer the substrate 210 within the processing region 211 of the process chamber 200 by use of commands from the system controller 290. The heating station 260 and the substrate support assembly 250 may each include a substrate lifting device (not shown) that enables the robotic device 270 to handoff the substrate to each station.

Figure 3:
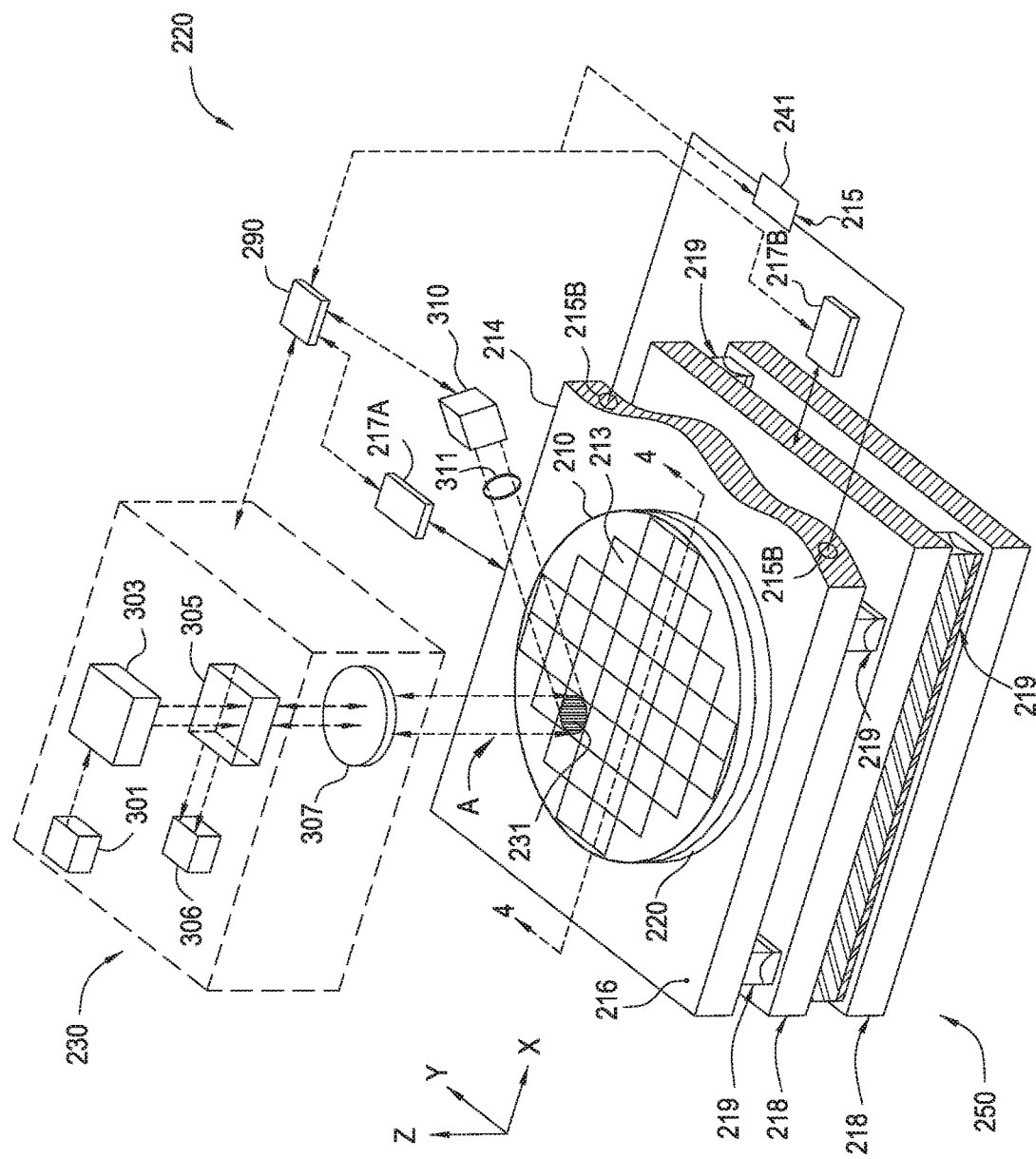
FIG. 3 is an isometric partial cross-sectional view of a stage assembly that may be used in the process chamber shown in FIG. 2, according to an embodiment of the disclosure.
Figure 4:
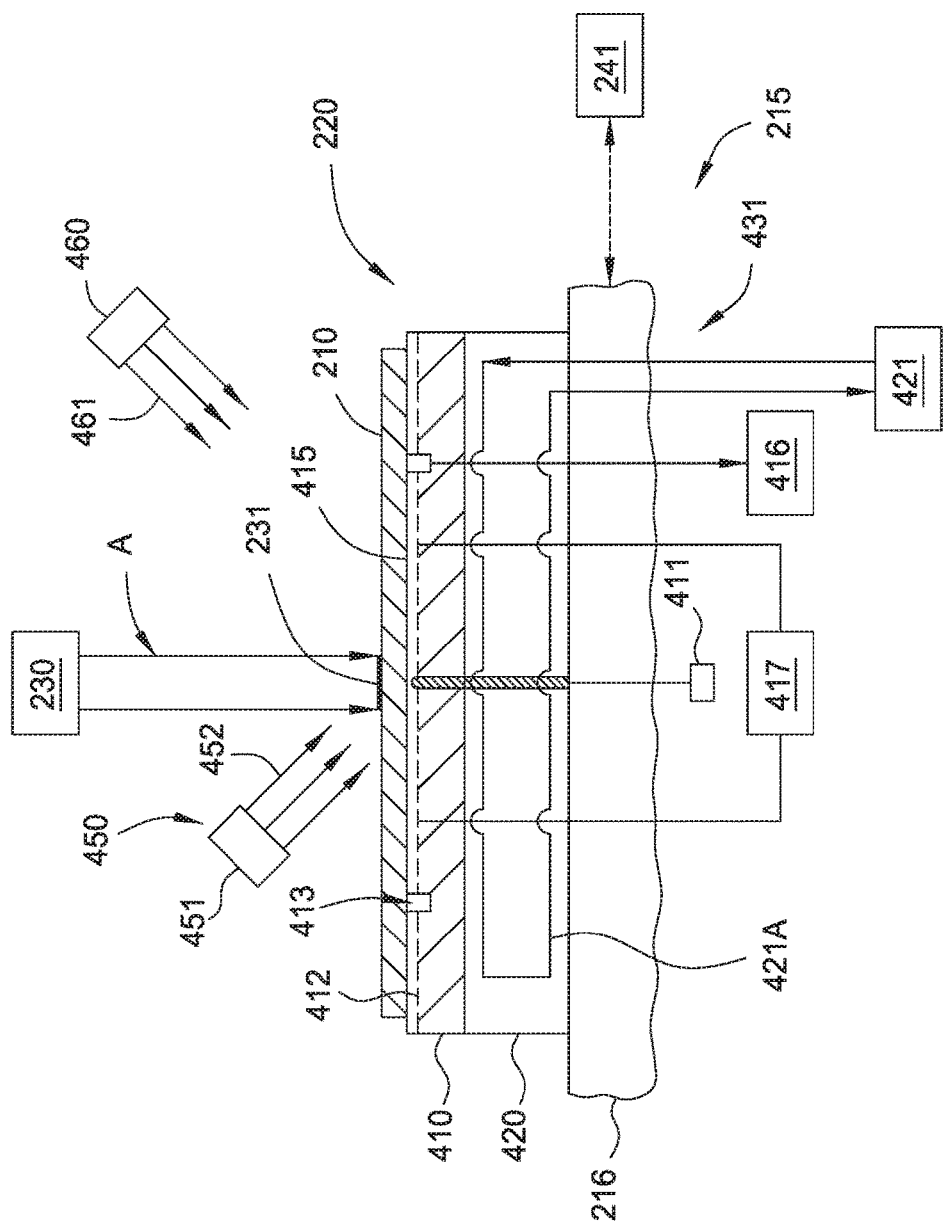
FIG. 4 is a side cross-sectional view of a substrate support that may be used in the process chamber shown in FIGS. 2 and 3, according to an embodiment of the disclosure.

FIG. 3 is an isometric view of one non-limiting example of the substrate support assembly 250 illustrated in FIG. 2. FIG. 4 is a side cross-sectional view of a support device 220 of the substrate support assembly 250 along section line 4-4 in FIG. 3. In this example, the substrate support assembly 250 includes one or more temperature controlling components and one or more translation enabling components that allows the substrate to be moved and/or positioned relative to the radiation "A" provided by the source 230. However, in some embodiments, the source 230 is adapted to scan the radiation "A" relative to the surface of a substrate that is positioned in a desired stationary position or is also being translated by the components in the substrate support assembly 250.

As briefly discussed above, the substrate supporting components are adapted to support, position, and control the temperature of the substrate 210 that is positioned on a support device 220. In some embodiments, the substrate support assembly 250 may contain one or more electrical actuators 217A, 217B (e.g., linear motor, lead screw and servo motor) and one or more stages 218, which are used to control the movement and position of the substrate 210. The stages 218 may contain a rotational element (not shown) that is able to support and rotate the support device 220 about the Z-axis and/or one or more linear slides 219 that are used to guide and translate the various substrate supporting components in at least one direction (e.g., X-direction and/or Y-direction). In one embodiment, the movement of a support device 220 that is positioned on the support assembly 214 in a Y-direction is controlled by use of an electrical actuator 217A and the movement of the support device 220 in an X-direction is controlled by use of an electrical actuator 217B.

The temperature of the substrate during processing is controlled by placing a substrate 210 in thermal contact with a substrate supporting surface 415 (FIG. 4) of the support device 220. The substrate supporting surface 415 is thermally controlled by use of one or more temperature controlling components found in the substrate support assembly 250. In some configurations, these temperature controlling components include the temperature control assembly 215, which includes the support temperature control assembly 431, and may additionally include a heat exchanging device 241 (FIG. 3).

Referring to FIG. 4, in some embodiments, the support device 220 may include a substrate chuck 410, base 420, temperature measuring element 411 (e.g., thermocouple, RTD, etc.) and the temperature control assembly 215. The base 420 is generally formed from a thermally conductive material, such as a metal or ceramic material (e.g., AlN). The base 420 is positioned on the supporting surface 216 of the support assembly 214 and is used to support the substrate 210 and substrate chuck 410. Portions of the base 420 are also used to transfer heat between a substrate 210, positioned on the substrate chuck 410, and the support temperature control assembly 431 that is thermally coupled to the base 420.

The substrate chuck 410 is generally formed from a thermally conductive material, such as a metal or ceramic material (e.g., AlN, SiC). The substrate chuck 410 may contain a mono-polar or a bipolar electrostatic chucking electrode 412 that can be biased by a chucking power source 417 so that an electrostatic chucking force can be provided to the substrate 210. The act of applying an electrostatic chucking force to the substrate, or "chucking" the substrate, is used to assure that the substrate 210 is in good thermal contact with the substrate supporting surface 415 of the support device 220. In some configurations, the substrate chuck 410 may include one or more grooves 413, which are formed in the substrate supporting surface 415 of the substrate chuck 410, to allow a gas to be provided to the backside of the substrate to increase the transfer of heat between the substrate 210 and the support device 220, while the substrate is chucked. Alternately, in some configurations, the grooves 413 allow a vacuum chucking force to be applied to the substrate 210 by use of a vacuum generating device 416 that cause the substrate to be chucked to the substrate supporting surface 415. In this case, the vacuum generating device 416 is configured to generate a low pressure within the grooves 413, which are positioned adjacent to a region of the backside of the substrate 210, to cause the substrate 210 to be urged against the substrate supporting surface 415 of the support device 220.

The support temperature control assembly 431 may include a gas and/or liquid heat exchanger, Peltier device, resistive elements or other similar device that is adapted to control the temperature of the substrate supporting surface 415 to a desired temperature. In one configuration, the temperature control assembly 431 includes a low temperature chiller 421 that is configured to deliver a cooling fluid through channels 421A formed in the base 420. In one example, the low temperature chiller 421 is adapted to circulate a cooling fluid (e.g., Galden HT55, liquid nitrogen, compressed helium, etc.) in the channels 421A to cool the substrate 210 to a temperature of less than 20° C., such as between about 0° C. and −100° C.

In some embodiments, the temperature control assembly 215 is also adapted to heat and/or cool the supporting surface 216 of the support assembly 214 by use of the heat exchanging device 241. The heat exchanging device 241 may include a gas and/or liquid heat exchanger, resistive elements and/or other similar device that is adapted to control the temperature of a supporting surface 216 to a desired temperature to provide an improved and more stable control of the temperature of the base 420, substrate chuck 410 and substrate 210 during processing. It is believed that the additional cooling of the supporting surface 216 may help assure that the temperature of the substrate chuck 410 and substrate 210 are stable when the substrate is chilled to a low processing temperature, such as between −30 and −100° C. during processing. In one example, the heat exchanging device 241 is adapted to circulate a cooling fluid through channels 215B (FIG. 3) to cool the supporting surface 216 to a temperature of less than 20° C., such as between about 0° C. and 10° C.

Referring back to FIG. 3, the process chamber 200 may include a source 230 that is configured to provide electromagnetic radiation to an exposed region 231 on the surface of the substrate 210. In one configuration, the source 230 includes a radiation source 301, a scanner/mirror 303, a beam splitter 305, an objective lens 307 and an optional radiation detector 306. In some configurations, the radiation source 301 is adapted to deliver an amount of coherent or non-coherent electromagnetic radiation to the exposed region 231. In one example, the radiation source 301 is configured to deliver electromagnetic radiation in the infrared, visible, ultraviolet, deep ultra violet and/or extreme deep ultra violet electromagnetic radiation ranges. The objective lens 307 is used to gather and focus the electromagnetic radiation produced by the radiation source 301, and may include a single lens or mirrors, or combinations of several optical elements. The scanner/mirror 303 may be used to adjust the position of the exposed region 231 relative to the surface of the substrate 210. In some configurations, the beam splitter 305 may include a mirror, or reflective surface, which is adapted to redirect electromagnetic radiation reflected or scattered from the surface of the substrate 210 to the optional radiation detector 306. The radiation detector 306 is a conventional radiation detecting device that is configured to detect the radiation reflected or scattered from the surface of the substrate 210, due to the delivery of the radiation "A" provided from the radiation source 301.

In configurations where the process chamber 200 is adapted to perform a wafer inspection type process, the radiation source 301 may operate at a DUV wavelength, for example 193 nm. In one example, the radiation source 301 is configured to deliver electromagnetic radiation in a "flood" like manner using a 2-D imaging sensor at a DUV wavelength to the exposed region 231 at a power level of between about 0.1 and about 10 Watts (W) and an illuminated area of between about 0.1 and 10 mm$^2$.

In another configuration, where the process chamber 200 is adapted to perform a wafer inspection type process, the radiation source 301 may operate at a short wavelength, for example, 248 nm or 193 nm, in order to produce a high resolution inspection technique that has a stable radiation source 301 output power (or stable pulse energy and pulse rate). In some configurations, the radiation source 301 is adapted to deliver electromagnetic radiation in a "spot" like manner at UV or shorter wavelengths, such as wavelengths of 400 nm or lower, such as 355 nm or lower, or even 300 nm or lower. In one example, the radiation source 301 is configured to deliver electromagnetic radiation at mid-UV or shorter wavelengths (e.g., 248 or 266 nanometers (nm)), to the exposed region 231 at a wafer-laser-power of between about 0.5 and about 2 milliWatt (mW), such as 1 mW and an illuminated area of between about 0.1 and 10 μm$^2$.

However, in some non-inspection type configurations, such as where the process chamber 200 is adapted to perform a laser induced thermal processing technique on a substrate 210, the radiation source 301 may operate at a visible or IR wavelength, such as >800 nm or greater in order to thermally process a substrate. In one example, the radiation source 301 is configured to deliver electromagnetic radiation at a visible wavelength, to the exposed region 231 for much longer durations and at a power level of between about 10 and about 1000 Watts (W). In one example, the source 230 may be configured to deliver a beam of energy that has a power density of between about 10 kW/cm$^2$ and about 200 kW/cm$^2$.

In another non-inspection type configuration, the process chamber 200 is adapted to perform a microwave source type thermal processing processes, the radiation source 301 can operate at a microwave frequency, such as 600 MHz or greater, in order to thermally process a substrate. In one example, the source 230 may be configured to deliver a beam of microwave energy that has a power density of between about 1.5 W/cm$^2$ and about 2.5 W/cm$^2$.

In some embodiments, the process chamber 200 may also include an optical subsystem 310 that includes an optical lens 311. In one configuration the optical subsystem 310 is configured to deliver electromagnetic radiation to the exposed region 231, so that the electromagnetic radiation reflected or scattered from the surface of the substrate 210 can be detected by the optional radiation detector 306 and used as received data in an inspection process. Alternately, the optical subsystem 310 is a radiation detector that is configured to detect the electromagnetic radiation reflected or scattered from the surface of the substrate 210, due to the delivery of the radiation "A" provided from the source 230.

In some embodiments, the process chamber 200 may also include a fluid delivery source assembly 450 that contains a source 451 that is configured to deliver a cooling fluid 452 to the exposed region 231 (FIG. 4) to prevent the materials within the exposed region 231 from being changed by the exposure to the radiation "A" delivered from the source 230. The cooling fluid 452 is cooled prior to exiting the source 451 by use of one or more heat exchanging elements (not shown). The cooling fluid 452 is generally delivered at a high flow velocity from the fluid delivery source assembly 450 to increase the convective heat transfer between the surface of the substrate and the cooling fluid 452. In one configuration, cooling fluid 452 includes a cooled gas, such as a dry, inert and/or non-reactive gas, such as nitrogen ($N_2$), argon (Ar), helium (He), neon (Ne), krypton (Kr), xenon (Xe) or other type of gas, or combinations thereof to the exposed region 231.

In some embodiments, the process chamber 200 may also include a localize temperature regulation source 460 that is adapted to heat and/or cool areas of the substrate surface during processing. In one example, the localize temperature regulation source 460 is used to pre-cool an area that will be exposed to the radiation "A" or post-cool an area that was exposed to the radiation "A" by delivering of a fluid to the surface of the substrate. While, in some configurations, the localize temperature regulation source 460 may include a lamp or other similar device that is used to prevent the surface 213 of the substrate from in some cases undesirably reaching the temperature of the substrate supporting surface 415 of the substrate chuck 410.

Processing Sequence Example

Figure 5:
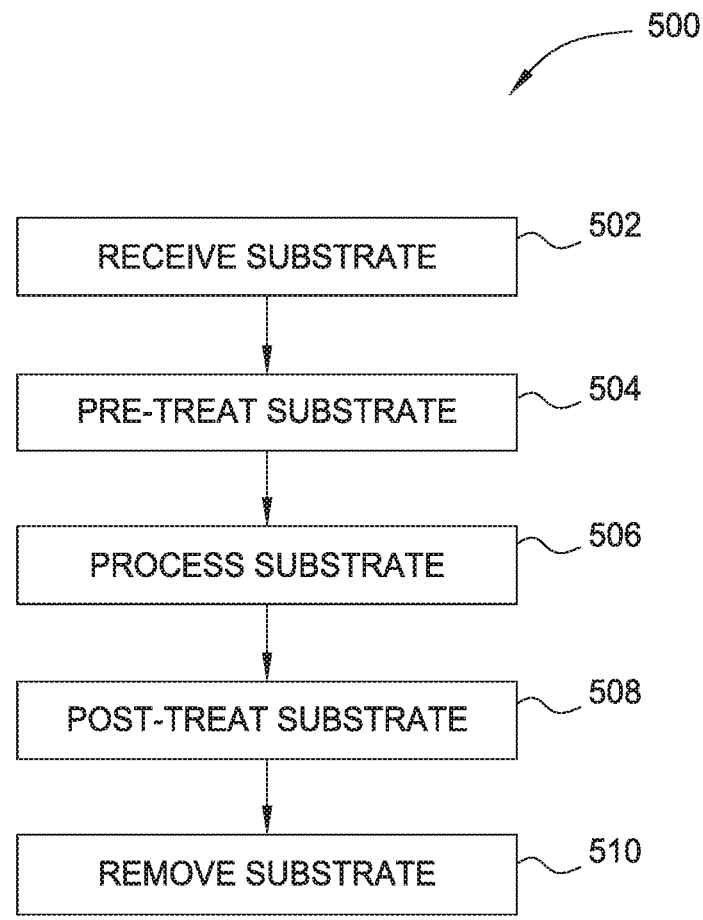
FIG. 5 is a flowchart depicting a processing sequence that is performed in a process chamber, according to embodiments described herein.

FIG. 5 illustrates a process sequence 500 that can be used to reduce the adverse effects of exposing portions of an integrated circuit (IC) device to various forms of radiation during one or more semiconductor fabrication operations. In general, the process sequence 500 includes a receive substrate operation 502, an optional pre-treat substrate process 504, a semiconductor processing operation 506, and optional post-treat substrate process 508 and a remove substrate process operation 510. At block 502, the process sequence 500 starts with an external robotic device, or user, transferring a substrate into the processing region 211 of a process chamber 200 (FIG. 2) through the sealable port 202. At block 502, the substrate may be positioned in or over the heating station 260 by use of the external robot. However, in cases where the subsequent block 504 is not performed, the external robot may position the substrate 210 on or over the substrate support assembly 250. After receiving the substrate 210, the process chamber 200 is then sealed by use of the slit valve (not shown) positioned within the sealable port 202. Then during block 502, and blocks 504-508, the pressure, gas composition and/or gas flow rate within the processing region 211 is adjusted by use of the exhaust system 205, gas delivery system 206 and system controller 290 to achieve a desired environment within the process chamber 200. The environmental conditions in the processing region 211 are typically adjusted by the system controller 290 to prevent the atmospheric contamination received while the sealable port 202 was open from condensing on the surfaces of the subsequently cooled substrate 210 and the cooled substrate support assembly 250 components.

Next, at block 504, the substrate 210 is then optionally pre-processed before the substrate 210 is further processed during block 506. In this block, the substrate is positioned on the surface 261A of the heating station 260 so that the substrate can be cooled or heated to a desired pre-processing temperature. In one example, as discussed above, the pre-processing temperature is less than room temperature, but greater than the dew point of the environment outside the process chamber. After performing the operations in block 504, the substrate 210 is then transferred from the heating station 260 to the substrate support assembly 250 using the robotic device 270.

Next, at block 506, one or more semiconductor processing operations are performed on the substrate 210 in the substrate support assembly 250. The semiconductor processing operation(s) performed during block 506 may include the delivery of radiation to the surface of a substrate during a deposition, etching, ashing, annealing, inspection and/or post-semiconductor processing operation, as discussed above. In some embodiments, the one or more semiconductor processing operations includes a non-contact optical inspection operation that is able to determine some physical property, material property or other compositional, dimensional or defect related attribute of the substrate. During block 506, the substrate 210 is positioned on a substrate supporting surface 415 of the support device 220 that has been cooled to a desired processing temperature, such as a temperature less than room temperature (e.g., −30 to −100° C.). In some embodiments, the substrate supporting surface 415 can be maintained at a specified lower temperature during (e.g., −30 to −100° C.) during part of or entire time of the exposure of the substrate 210 to radiation as described below. The substrate 210 is then "chucked" to the substrate supporting surface 415 of the support device 220 and an amount of electromagnetic radiation "A" is delivered to an exposed region 231 of the surface of the substrate 210. It is believed that the techniques performed during block 506 will be useful when the incident power level of the delivered radiation "A" exceeds the threshold power level $P_T$, as discussed above. Thus, by use of the techniques described herein, the generated radiation "A" can be delivered to the surface of the substrate without damaging the exposed materials or material layers found in the exposed regions 231 by controlling the environment surrounding and temperature of the substrate 210.

Next, at block 508, the substrate 210 is optionally post-processed after block 506 has been performed. Prior to or during block 508, the substrate 210 is transferred from the substrate support assembly 250 to the heating station 260, using the robotic device 270. In block 508, the substrate may be positioned on the surface 261A of the heating station 260 so that substrate can be heated to a desired post-processing temperature. In one example, as discussed above, the post-processing temperature is between about 10° C. and 50° C. In one non-limiting example, the post-processing temperature is less than room temperature, but greater than the dew point of the environment outside the process chamber. The post-processing temperature can be greater than the processing temperature at which the supporting surface 415 was maintained during block 506 (i.e., the temperature −30 to −100° C.).

At block 510, an external robotic device, or user, removes the substrate 210 from the processing region 211 of a process chamber 200. In this process operation, the substrate may be removed from a position in or over the heating station 260 by use of the external robot, and the process chamber 200 may then be re-sealed by use of the slit valve in the sealable port 202. During block 510, the pressure, gas composition and/or gas flow rate within the processing region 211 may be adjusted to achieve a desired processing environment within the process chamber 200 to prevent contamination received while the sealable port 202 was open, from condensing on the surfaces of the cooled substrate support assembly 250 components.

One or more embodiments of the disclosure may be implemented as a program product for use with a computer system found within the system controller 290. The program(s), or coded process sequences, of the program product define the functions of the various embodiments disclosed herein (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

While the foregoing is directed to embodiments of the disclosure, other and further embodiments of the disclosure may be devised without departing from the basic scope thereof, and the scope thereof is determined by the claims that follow.

The invention claimed is:

1. A substrate inspection apparatus, comprising:
   a substrate support disposed within a processing region of the substrate inspection apparatus, wherein the substrate support comprises a substrate chuck that has a substrate supporting surface;
   a radiation source that is configured to inspect a substrate by delivering radiation to a surface of a substrate disposed on the substrate supporting surface during an inspection process;
   a support assembly that comprises one or more actuators that are configured to translate the substrate support relative to the radiation source;
   a temperature control assembly that is in thermal communication with the substrate supporting surface, wherein the temperature control assembly is configured to cool the substrate supporting surface to a first temperature that is less than 20° C. during the inspection process; and
   a radiation detector configured to detect radiation reflected or scattered from a surface of a substrate that is disposed on the substrate supporting surface.

2. The substrate inspection apparatus of claim 1, wherein the radiation source is configured to generate electromagnetic radiation or an electron beam.

3. The substrate inspection apparatus of claim 2, wherein the radiation source is configured to generate electromagnetic radiation at a wavelength of between about 193 nm and 355 nm.

4. The substrate inspection apparatus of claim 1, further comprising:
   an enclosure that comprises one or more walls that define the processing region; and
   a thermal control device that has a substrate supporting surface that is disposed in the processing region, and is configured to maintain the substrate supporting surface of the thermal control device at a temperature greater than the first temperature.

5. The substrate inspection apparatus of claim 1, further comprising:
   an enclosure that comprises one or more walls that define the processing region, wherein the enclosure is sealable during the inspection process to prevent atmospheric contamination from entering the process region during the inspection process; and
   a thermal control device that has a substrate supporting surface that is disposed in the processing region, and is configured to maintain the substrate supporting surface of the thermal control device at a temperature greater than a dew point of an atmospheric environment positioned in a region external to the processing region.

6. The substrate inspection apparatus of claim 5, further comprising a gas source that is configured to deliver a dry gas to the processing region, wherein the dry gas comprises nitrogen ($N_2$), argon (Ar), helium (He), neon (Ne), krypton (Kr) or xenon (Xe).

7. The substrate inspection apparatus of claim 1, wherein the substrate chuck further comprises an electrostatic chuck that comprises a bias electrode and a chucking power source.

8. The substrate inspection apparatus of claim 7, wherein the substrate chuck further comprises one or more grooves that are formed in the substrate supporting surface and are configured to receive a gas from a gas source.

9. The substrate inspection apparatus of claim 1, further comprising:
   an objective lens that is disposed between the radiation source and the substrate support.

10. The substrate inspection apparatus of claim 9, wherein the objective lens is disposed between the radiation detector and the substrate support.

11. A substrate inspection apparatus, comprising:
    a sealed enclosure that comprises a port that is selectively sealable to prevent contamination from entering a processing region formed therein during an inspection process;
    a substrate support disposed in the processing region comprising a base having one or more channels;
    a radiation source that is configured to inspect a substrate by delivering radiation to a substrate disposed on the substrate supporting surface during the inspection process;
    a chiller coupled to the one or more channels; and
    a radiation detector configured to detect radiation reflected or scattered from a surface of a substrate that is disposed on the substrate supporting surface.

12. The substrate inspection apparatus of claim 11, wherein the chiller is configured to circulate a cooling fluid through the one or more channels during the inspection process.

13. The substrate inspection apparatus of claim 11, further comprising a support assembly that comprises one or more actuators that are configured to translate the substrate support relative to the radiation source.

14. The substrate inspection apparatus of claim 11, further comprising:
    an objective lens that is disposed between the radiation source and the substrate support.

15. The substrate inspection apparatus of claim 14, wherein the objective lens is disposed between the radiation detector and the substrate support.

16. A substrate inspection apparatus, comprising:
an enclosure that comprises one or more walls that define a processing region;
a substrate support disposed in the processing region;
a radiation source that is configured to inspect a substrate by delivering radiation to a substrate disposed on the substrate supporting surface during an inspection process, the substrate having a first surface including a patterned structure;
a temperature regulation source configured to cool a localized area of the first surface without cooling other portions of the first surface; and
a radiation detector configured to detect radiation reflected or scattered from a surface of a substrate that is disposed on the substrate supporting surface.

17. The substrate inspection apparatus of claim 16, wherein the temperature regulation source is configured to cool the localized area of the first surface prior to exposure of the localized area to radiation during the inspection process.

18. The substrate inspection apparatus of claim 16, further comprising a chiller, wherein the substrate support comprises a base including one or more channels coupled to the chiller.

19. The substrate inspection apparatus of claim 18, wherein the temperature regulation source is configured to cool the substrate from above the substrate support.

20. The substrate inspection apparatus of claim 16, further comprising:
an objective lens that is disposed between the radiation source and the substrate support.

* * * * *